United States Patent
Kojima

(10) Patent No.: US 8,587,038 B2
(45) Date of Patent: Nov. 19, 2013

(54) ELECTRIC COMPONENT AND METHOD OF MANUFACTURING THE ELECTRIC COMPONENT

(75) Inventor: Akihiro Kojima, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 218 days.

(21) Appl. No.: 12/841,286

(22) Filed: Jul. 22, 2010

(65) Prior Publication Data

US 2011/0049578 A1 Mar. 3, 2011

(30) Foreign Application Priority Data

Aug. 26, 2009 (JP) .................. 2009-195659

(51) Int. Cl.
H01L 29/84 (2006.01)

(52) U.S. Cl.
USPC .................. 257/257; 257/E21.575

(58) Field of Classification Search
USPC .......... 257/254, E21.575, E23.169; 438/121, 438/50, 666
See application file for complete search history.

(56) References Cited

U.S. PATENT DOCUMENTS

| | | | | |
|---|---|---|---|---|
| 5,079,177 A * | 1/1992 | Lage et al. | .......... | 438/203 |
| 5,378,652 A * | 1/1995 | Samata et al. | .......... | 438/647 |
| 7,671,430 B2 | 3/2010 | Inaba et al. | | |
| 2005/0122005 A1 | 6/2005 | Higuchi et al. | | |
| 2007/0228573 A1* | 10/2007 | Matsunaga et al. | .......... | 257/758 |
| 2008/0029801 A1* | 2/2008 | Nakamura | .......... | 257/303 |
| 2008/0128841 A1 | 6/2008 | Fujimori et al. | | |
| 2008/0224241 A1* | 9/2008 | Inaba et al. | .......... | 257/415 |
| 2009/0064785 A1 | 3/2009 | Fukuda et al. | | |
| 2009/0075465 A1* | 3/2009 | Fan | .......... | 438/586 |
| 2009/0188709 A1 | 7/2009 | Kojima et al. | | |

FOREIGN PATENT DOCUMENTS

| | | |
|---|---|---|
| JP | 63-250176 | 10/1988 |
| JP | 09-148270 | 6/1997 |
| JP | 11-067910 | 3/1999 |
| JP | 2004-186680 | 7/2004 |
| JP | 2004-363124 | 12/2004 |
| JP | 2006-263902 | 10/2006 |
| JP | 2007-134453 | 5/2007 |
| JP | 2007-214383 | 8/2007 |
| JP | 2008-140867 | 6/2008 |
| JP | 2008-153817 | 7/2008 |

OTHER PUBLICATIONS

Japanese Office Action for Japanese Application No. 2009-195659 mailed on Jan. 4, 2012.
Office Action issued on Apr. 26, 2013 on the corresponding Taiwanese Patent Application No. 099125088, an English translation thereof.

* cited by examiner

Primary Examiner — Vongsavanh Sengdara
(74) Attorney, Agent, or Firm — White & Case LLP

(57) ABSTRACT

According to one embodiment, an electric component includes: a first insulating layer formed on a first wire; a second wire and a functional element formed on the first insulating layer; a second insulating layer formed on the first insulating layer; and a connection wire that connects the second wire and the first wire. In the connection wire, a first via, a second via, and an inter-via wire are integrally formed of the same material. The first via is formed in the second insulating layer. The second via is formed in the first and second insulating layers.

14 Claims, 11 Drawing Sheets

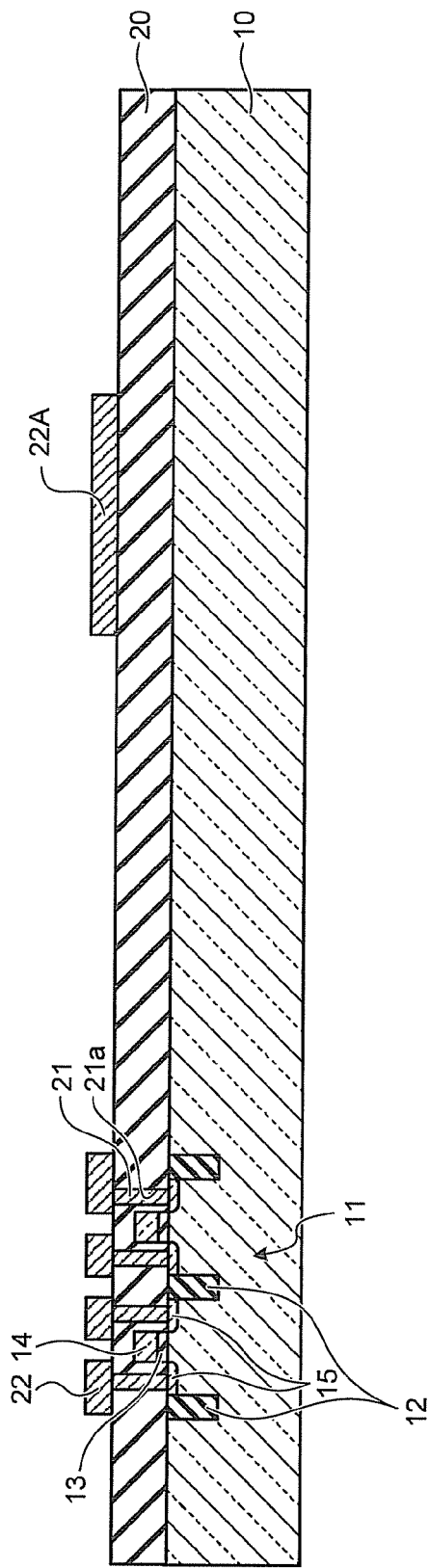

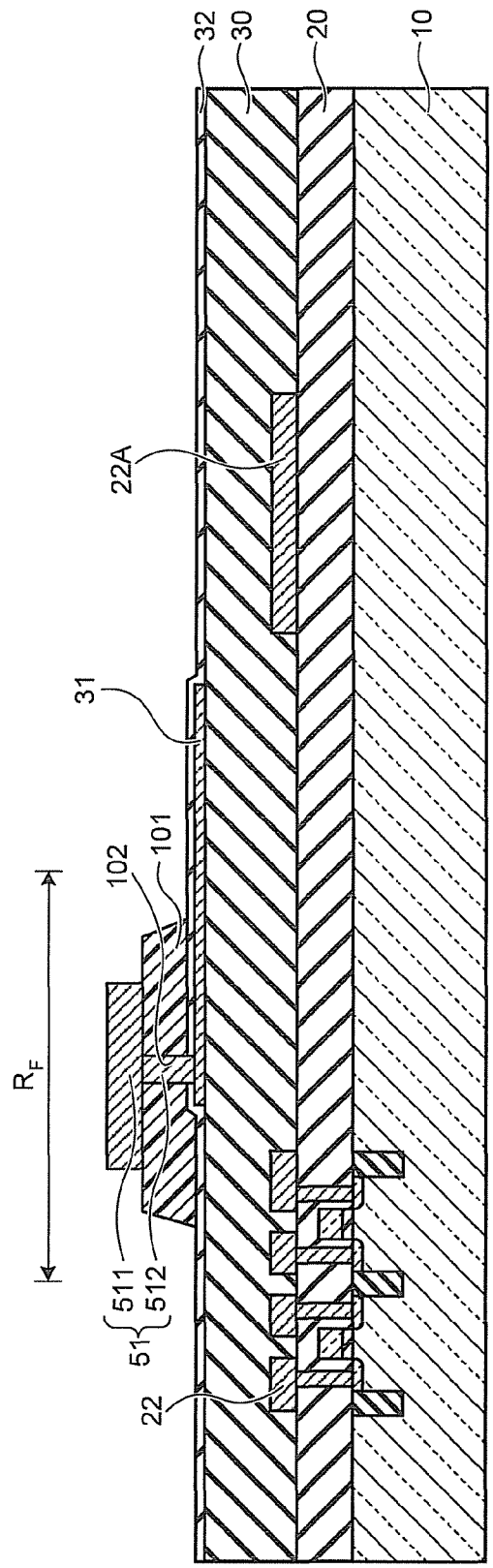

ELECTRIC COMPONENT AND METHOD OF MANUFACTURING THE ELECTRIC COMPONENT

CROSS-REFERENCE TO RELATED APPLICATIONS

This application is based upon and claims the benefit of priority from the prior Japanese Patent Application No. 2009-195659, filed on Aug. 26, 2009; the entire contents of which are incorporated herein by reference.

FIELD

Embodiments described herein relate generally to an electric component and a method of manufacturing the electric component.

BACKGROUND

As one of methods of integrating a plurality of semiconductor elements, a method of stacking chips is used.

In this method, after separately forming semiconductor elements on semiconductor substrates such as Si substrates, the semiconductor substrates and the semiconductor elements are stacked. Therefore, the semiconductor substrates are necessary for the respective elements. As a result, a reduction in thickness is limited and cost increases. Therefore, as a method of stacking a plurality of semiconductor elements having different functions to form an electric component, a method of, after forming an element on a single semiconductor substrate, continuously forming another element on the semiconductor substrate is proposed (see, for example, Japanese Patent Application Laid-Open No. 2008-140867). Specifically, first, a semiconductor element such as an integrated circuit and a wiring layer are formed. Subsequently, before formation of a functional element such as a MEMS element, a contact hole for electrically connecting the functional element and the wiring layer is formed in an insulating film present between the functional element and the wiring layer. Thereafter, the functional element is formed and a conductive material is filled in the contact hole to electrically connect the functional element and the wiring layer. In this way, an electric component is manufactured.

However, in the electric component in the past, a wiring structure for electrically connecting the semiconductor element such as the integrated circuit and the functional elements is additionally formed in the insulation layer between the semiconductor element and the functional element. Therefore, connection interfaces between the elements increase. As a result, it is likely that wiring structures are not connected on the connection interfaces and reliability of the electric component falls. In the method of manufacturing the electric component in the past, when an interlayer insulating film is formed between elements, formation of a contact hole for connecting the elements, formation of a wiring layer, and the like are generally performed for each interlayer insulating film to be formed. Therefore, the number of steps increases and productivity falls.

BRIEF DESCRIPTION OF THE DRAWINGS

FIGS. 2A to 2I are schematic partial sectional views for explaining an example of a method of manufacturing the electric component according to the embodiment.

DETAILED DESCRIPTION

In general, according to one embodiment, an electric component includes: a first wire connected to a circuit element and having a predetermined shape; a first insulating layer formed on the first wire; a second wire formed on the first insulating layer; a functional element formed on the first insulating layer and connected to the second wire; a second insulating layer that covers the second wire and the functional element; and a connection wire that connects the second wire and the first wire. In the connection wire, a first via, a second via, and an inter-via wire are integrally formed of the same material. The first via is formed in the second insulating layer. The second via is formed in the first and second insulating layers. The inter-via wire is formed to connect the first via and the second via on the second insulating layer.

Exemplary embodiments of an electric component and a method of manufacturing the electric component will be explained below in detail with reference to the accompanying drawings. The present invention is not limited to the following embodiments. Sectional views of an electric component referred to in the embodiments explained below are schematic. A relation between the thickness and the width of a layer, a ratio of the thicknesses of layers, and the like are different from actual ones.

Figure 1:
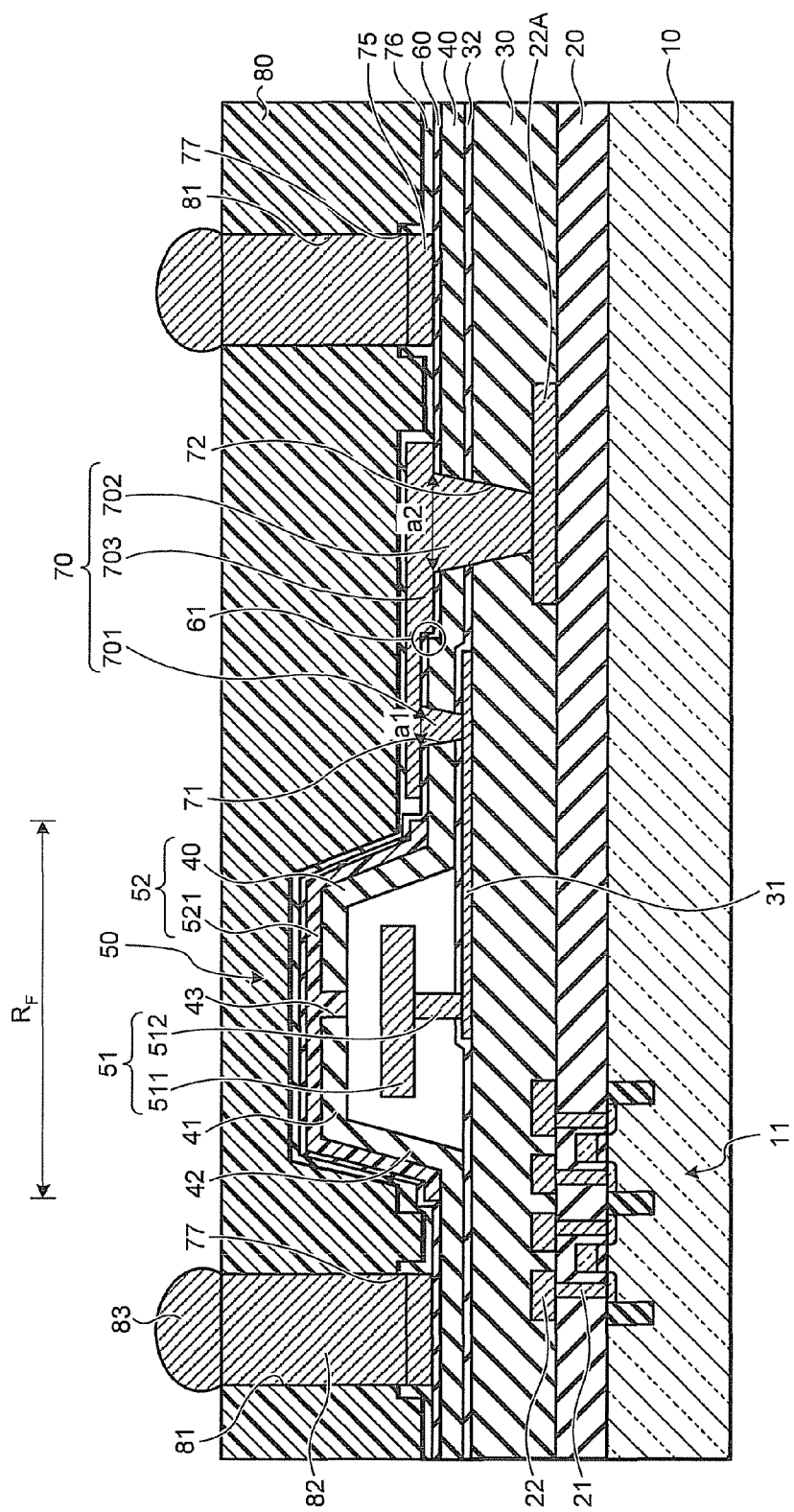
FIG. 1 is a schematic sectional view of an example of an electric component according to an embodiment.

FIG. 1 is a schematic sectional view of an example of the configuration of an electric component according to an embodiment. The schematic configuration of the electric component is explained with reference to FIG. 1. A complementary metal-oxide semiconductor (CMOS) transistor 11 as a circuit element is formed on a semiconductor substrate 10 such as a silicon substrate. On the semiconductor substrate on which the CMOS transistor 11 is formed, for example, a first insulating film 20 formed of a silicon oxide film having thickness of, for example, 5.0 micrometers is formed. First wires 22 and 22A are formed on the first insulating film 20. The first wires 22 and 22A are connected to source and drain regions of the CMOS transistor 11 via contacts 21 formed in the first insulating film 20. The first wire 22A is a wire formed to be drawn around on the first insulating film 20 to connect the CMOS transistor 11 and a MEMS element 50 to be formed later. The first wire 22A for connection to the MEMS element 50 is formed around the right side in the figure.

On the first insulating film 20 on which the first wires 22 and 22A are formed, a second insulating film 30 formed of, for example, a silicon oxide film having a Si—O framework or an organic film containing carbon as a main component having thickness of, for example, 5.0 micrometers is formed. On the second insulating film 30, a second wire 31 formed of aluminum having thickness of, for example, 1.0 micrometer and the MEMS element 50 such as a high-frequency filter as a functional element are formed. A first passivation film 32 is formed on the second wire 31 and the second insulating film 30. The first passivation film 32 is formed of a silicon nitride film having thickness of, for example, 0.2 micrometer.

The MEMS element 50 has a structure in which a MEMS movable element 51 and a cap film 52 having a thin-film capsule structure shape that covers sides and the upper surface of the MEMS movable element 51 are formed in a functional element forming region $R_F$ on the second insulating film 30. The MEMS movable element 51 includes an oscillator 511 extending in a predetermined direction and a plurality of anchors 512 as supporting members that support the oscillator 511. Both of the oscillator 511 and the anchors 512 are formed of a conductive material such as aluminum. Lower parts of the anchors 512 are electrically connected to the second wire 31 formed in the functional element forming region $R_F$.

The cap film 52 includes a third insulating film 40 and an over-seal layer 521. The third insulating film 40 has an upper surface section 41 having a structure of a capsule shape, which covers the MEMS movable element 51 at a predetermined space, and substantially parallel to a substrate surface and side sections 42 that connect the upper surface section 41 and the upper surface of the first passivation film 32. In the upper surface section 41 of the third insulating film 40, a through hole 43 for sacrificial layer removal piercing through the third insulating film 40 in the thickness direction is formed. Therefore, a region surrounded by the third insulating film 40 and the first passivation film 32 is a hollow structure. In a region other than the functional element forming region $R_F$, the third insulating film 40 is formed to cover the first passivation film 32. The third insulating film 40 is formed of a silicon oxide film or the like having thickness of, for example, 3.0 micrometers.

The over-seal layer 521 is provided in a region including the upper surface of the third insulating film 40 to cover the through hole 43 formed in the third insulating film 40. The over-seal layer 521 is formed of an organic material film such as polyimide or an insulating film such as a silicon oxide film or a silicon nitride film having thickness of, for example, 3.0 micrometers.

On the MEMS element 50 and the third insulating film 40, a fourth insulating film 60 formed of a silicon oxide film, an organic film containing carbon as a main component, or the like having thickness of 0.5 micrometer is formed. The second wire 31 connected to the MEMS movable element 51 is formed to be drawn out to a formation position side of the first wire 22A. Therefore, a step 61 is formed near an end of the second wire 31 in the third insulating film 40 and the fourth insulating film 60 formed on the second wire 31.

The first wire 22A connected to the CMOS transistor 11 and the second wire 31 connected to the MEMS element 50 are connected to each other by a connection wire 70. Specifically, the connection wire 70 includes a first via 701 and a second via 702 and an inter-via wire 703 that connects the first and second vias 701 and 702. The first via 701 and the second via 702 are formed by filling a conductive material such as copper in a first via hole 71 provided to pierce through from the fourth insulating film 60 to the first passivation film 32 to correspond to a formation position of the second wire 31 and a second via hole 72 provided to pierce through from the fourth insulating film 60 to the second insulating film 30 to correspond to a formation position of the first wire 22A. The connection wire 70, i.e., the first and second vias 701 and 702 and the inter-via wire 703 are integrally formed of the same material and in the same process. Because the inter-via wire 703 is formed to connect the formation positions of the first wire 22A and the second wire 31, the inter-via wire 703 is formed on the step 61. Therefore, the lower surface of the inter-via wire 703 has a step but the upper surface there of is substantially flat.

On the fourth insulating film 60, third wires 75 for supplying electric power to the CMOS transistor 11 from the outside are formed. Further, a second passivation film 76 formed of a silicon nitride film having thickness of, for example, 0.2 micrometer is formed to cover the fourth insulating film 60, the connection wire 70, and the third wires 75. In parts of the second passivation film 76 formed on the third wires 75, openings 77 are provided to be connected to pillar members 82 to be formed later. A resin layer 80 having a planarized upper layer is provided to cover the second insulating film 30 and the third wires 75. The resin layer 80 also has a barrier function against steam. In the resin layer 80, through holes 81 are provided to correspond to formation positions of the third wires 75. The pillar members 82 filled with a conductive material such as copper are formed to fill the through holes 81. On the pillar members 82, bumps 83 for connecting the pillar members 82 to an external wire are provided.

A shape of the first via hole 71 and the second via hole 72 is explained below. As explained above, the depth of the second via hole 72 is larger than the depth of the first via hole 71. A diameter (an opening diameter) a2 in an upper part of the second via hole 72 is larger than a diameter (an opening diameter) a1 in an upper part of the first via hole 71. In other words, an opening diameter of a via hole formed shallow is set small and an opening diameter of a via hole formed deep is set large. This makes it possible to equalize effective aspect ratios of the first via hole 71 and the second via hole 72. Because the diameter a1 of the first via hole 71 connected to the second wire 31 is set smaller than the diameter a2 of the second via hole 72 connected to the first wire 22A, a chip area of the functional element section can be reduced compared with a chip area of the functional element section formed when the diameter a1 of the first via hole 71 is set the same as the diameter a2 of the second via hole 72.

Figure 2B:
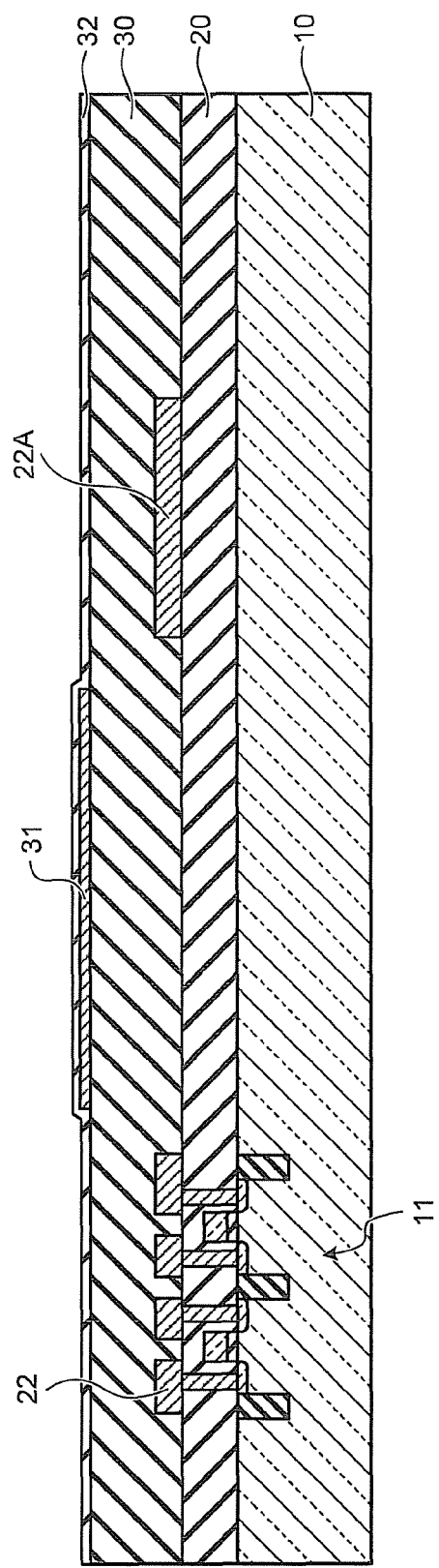

FIGS. 2A to 2I are schematic partial sectional views for explaining an example of a method of manufacturing the electric component according to this embodiment. First, as shown in FIG. 2A, the CMOS transistor 11 as a circuit element is formed on the semiconductor substrate 10 such as a silicon substrate by using a normal semiconductor manufacturing process. For example, device isolation insulating films 12 are formed on the surface of the semiconductor substrate 10. MOS transistors having stacked members of gate insulating films 13 and gate electrodes 14, and source and drain regions 15 formed on the surface of the semiconductor substrate 10 on both sides in a line width direction of the stacked members are formed in regions sectioned by the device isolation insulating films 12. In the case of P-type MOS transistors, source and drain regions are formed of P-type impurity diffusion layers. In the case of N-type MOS transistors, source and drain regions are formed of N-type impurity diffusion layers.

Thereafter, the first insulating film 20 is formed on the semiconductor substrate 10 on which the CMOS transistor 11 is formed. Contact holes 21a for connection to the CMOS transistor 11 in a lower layer are formed in the first insulating film 20. Subsequently, contacts 21 filling the inside of the contact holes 21a are formed. The first wires 22 and 22A connected to the CMOS transistor 11 are formed on the first insulating film 20. Examples of the first insulating film 20 include a silicon oxide film (SiO film) and an organic film containing carbon as a main component having thickness of 5.0 micrometers formed by a plasma chemical vapor deposition (CVD) method. The contacts 21 are formed of a conductive material such as tungsten. The first wires 22 are formed by, after forming a conductive material film of tungsten, aluminum, or the like on the first insulating film 20 at thickness of about 1.0 micrometer, patterning the conductive material film into a predetermined shape using a lithography technique and an etching technique.

Subsequently, as shown in FIG. 2B, the second insulting film 30 formed of a silicon oxide film, an organic film containing carbon as a main component, or the like having thickness of 5.0 micrometers is formed on the first insulating film 20, on which the first wires 22 are formed, by a film forming method such as the plasma CVD method. Thereafter, a conductive material film of aluminum or the like is formed on the second insulating film 30 at thickness of about 1.0 micrometer. The second wire 31 for connection to the MEMS element 50 is patterned by using the lithography technique and the etching technique. The second wire 31 is patterned to be drawn out to near the formation position of the first wire 22A in a lower layer to which the second wire 31 is connected later. The first passivation film 32 having thickness of several hundreds nanometers to several micrometers formed of a silicon oxide film, a silicon nitride film, or the like is formed on the second insulating film 30 on which the second wire 31 is formed.

Subsequently, the MEMS element 50 is formed in the functional element forming region $R_F$ by using a normal MEMS forming process. For example, as shown in FIG. 2C, a first sacrificial layer 101 having thickness of, for example, 2.5 micrometers is formed in a region including the second wire 31 in the functional element forming region $R_F$ such that a section of the first sacrificial layer 101 perpendicular to the substrate surface is a trapezoidal shape. A through hole 102, which reaches the second wire 31, for forming the anchor 512 for supporting and fixing the oscillator 511 to be formed later is formed in a position corresponding to the formation position of the second wire 31 of the first sacrificial layer 101. Thereafter, a metal film of Al or the like is formed on a passivation film in which the first sacrificial layer 101 is formed. The metal film is formed at thickness of about 2.0 micrometers such that the metal film is also filled in the through hole 102. The metal film is patterned into the shape of the oscillator 511 by using the lithography technique and the etching technique. Consequently, the MEMS movable element 51 having a structure in which the oscillator 511 is supported by the anchor 512 is formed.

Figure 2D:
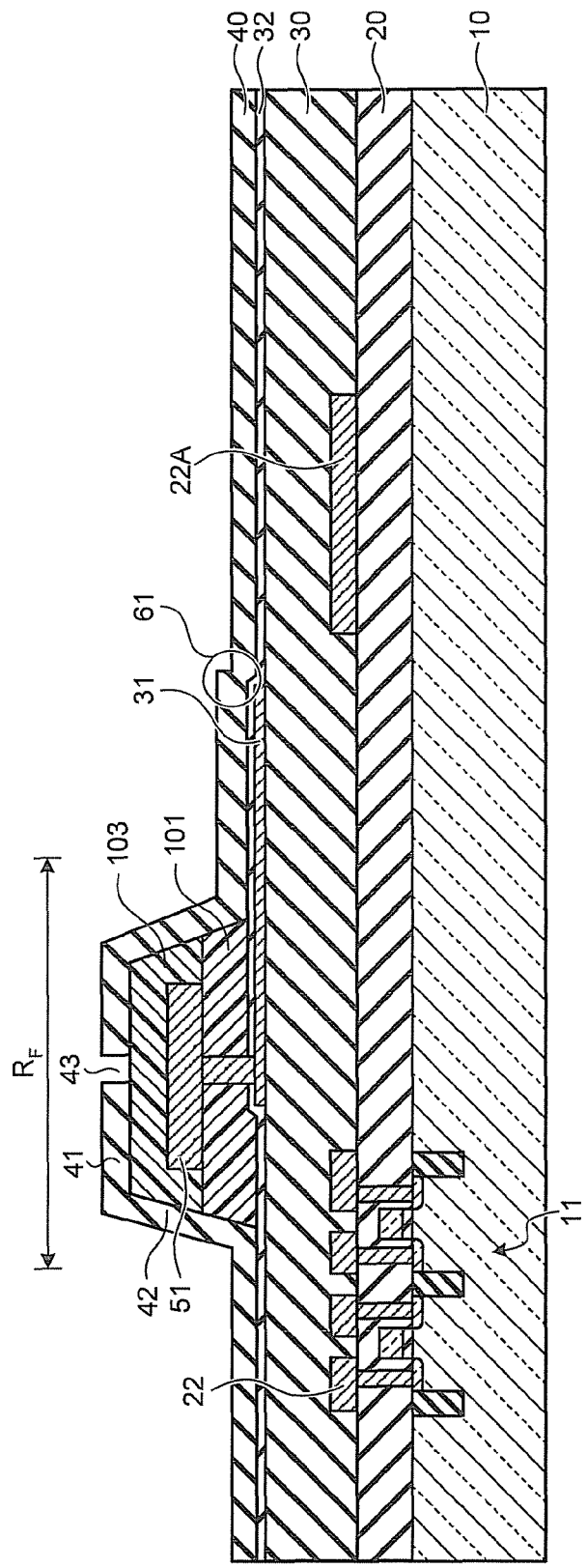

Subsequently, as shown in FIG. 2D, a second sacrificial layer 103 having thickness of, for example, 6.0 micrometers is formed on the first sacrificial layer 101, on which the MEMS movable element 51 is formed, by using an organic material such as polyimide such that a section of the second sacrificial layer 103 perpendicular to the substrate surface is a trapezoidal shape. Thereafter, the third insulating film 40 formed of a silicon oxide film, a silicon nitride film, or the like is formed at thickness of about 3.0 micrometers over the entire surface of the first passivation film 32 on which the second sacrificial layer 103 is formed. Consequently, in the functional element forming region $R_F$, the third insulating film 40 is formed in a structure of a convex shape to match the shape of a stacked structure of the first and second sacrificial layers 101 and 103. Specifically, the upper surface section 41 parallel to the substrate surface and the side sections 42 that connect the first passivation film 32 and the upper surface section 41 are formed on the functional element forming region $R_F$. The step 61 is formed in the third insulating film 40 formed on the end of the second wire 31.

Subsequently, not-shown resist is applied on the third insulating film 40 and exposure and development of the resist are performed by the lithography technique to form a resist pattern for forming the through hole 43 for sacrificial layer removal in a predetermined position in the functional element forming region $R_F$. With the resist pattern as a mask, the third insulating film 40 is etched by using a dry etching method such as the reactive ion etching (RIE) method or a wet etching method to form the through hole 43. The through hole 43 is formed near the center of the upper surface section 41 of the third insulating film 40.

Figure 2E:
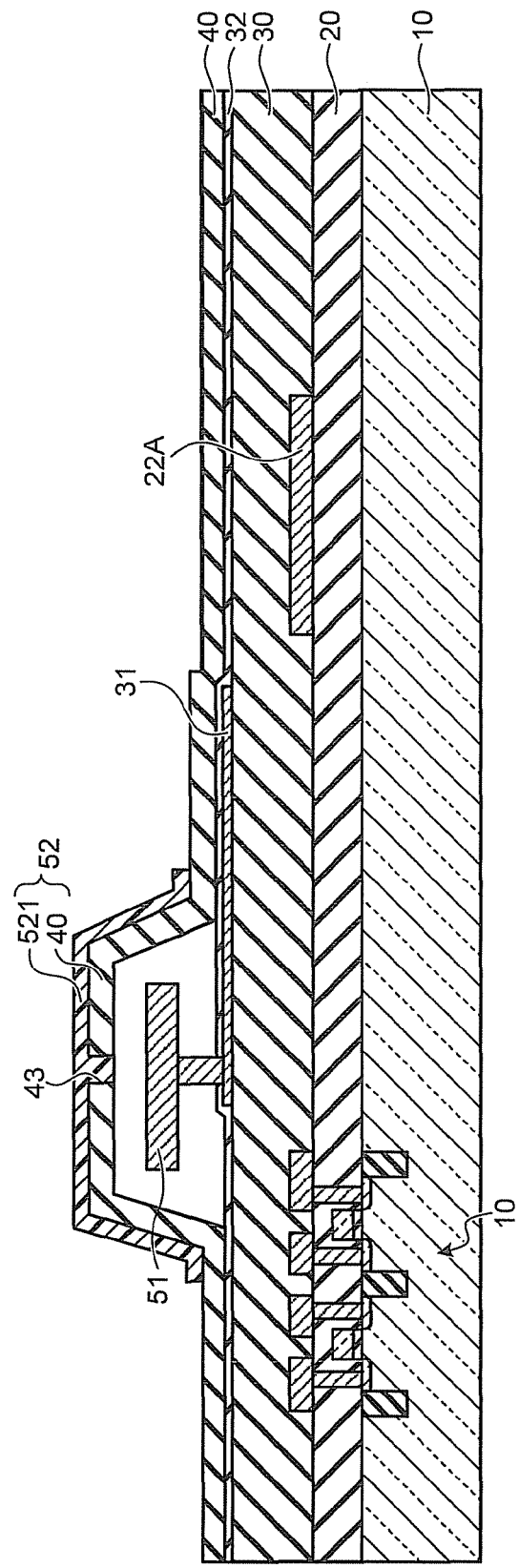

Thereafter, as shown in FIG. 2E, the resist pattern formed on the first insulating film 20 and the second and first sacrificial layers 103 and 101 are removed by stripping using $O_2$ gas or the like. Stripping of the second sacrificial layer 103 is performed by using the $O_2$ gas flown in via the through hole 43. Stripping of the first sacrificial layer 101 is performed by using the $O_2$ gas in the same manner after the second sacrificial layer 103 is removed. Consequently, the inside of the concave shape structure of the third insulating film 40 is hollowed. Subsequently, the over-seal layer 521 is formed on the first insulating film 20 at thickness of about 3.0 micrometers to close the through hole 43 formed in the third insulating film 40. The over-seal layer 521 is formed by forming a film by applying an organic material such as polyimide or forming an insulating film such as a silicon oxide film or a silicon nitride film with a method such as the CVD method. Consequently, the hollow section is sealed and the cap film 52 of a thin-film capsule structure is completed in the functional element forming region $R_F$.

Figure 2F:
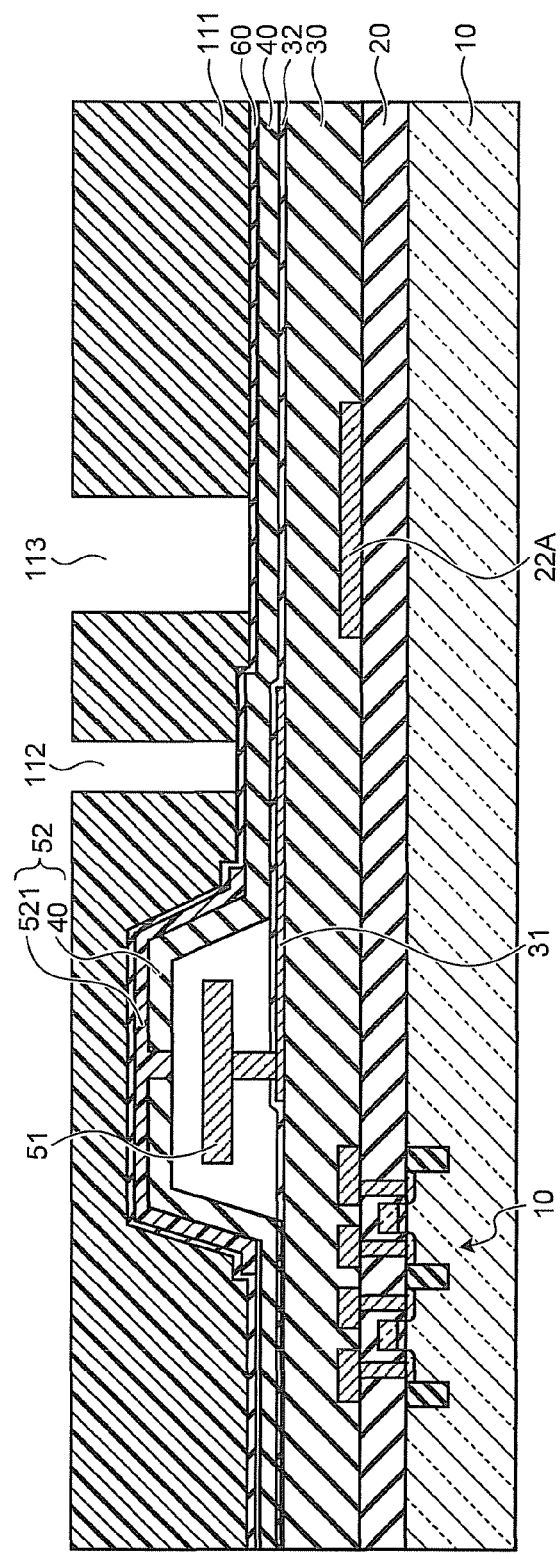

Subsequently, as shown in FIG. 2F, the fourth insulating film 60 formed of a silicon oxide film or a silicon nitride film is formed on the cap film 52 and the third insulating film 40 at thickness of, for example, about several micrometers by a method such as the CVD method. Thereafter, resist 111 is applied over the entire surface on the second insulating film 30. A resist pattern having an opening 112 for forming the first via hole 71 reaching the second wire 31 and an opening 113 for forming the second via hole 72 reaching the first wire 22A is formed by the lithography technique. The resist 111 is patterned such that a diameter c1 of the opening 112 for forming the first via hole 71 is smaller than a diameter c2 of the opening 113 for forming the second via hole 72. More desirably, the resist 111 is patterned such that aspect ratios of formed via holes are equal in etching sections in a later process and, more specifically, an opening diameter is large in a position where etching is performed to a deep place.

Figure 2G:
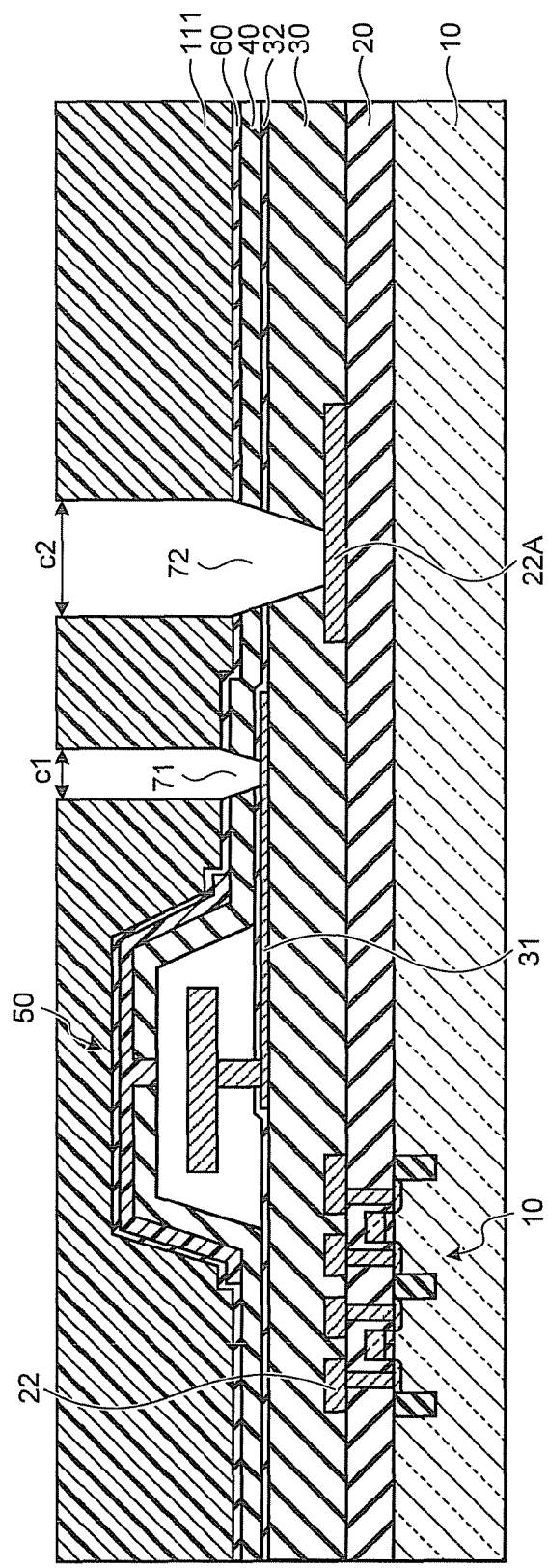

Subsequently, as shown in FIG. 2G, etching is performed by a method such as the RIE method with the resist 111, in which the pattern is formed, as a mask. The etching is performed under a condition that the first and second wires 22A and 31 function as stopper films. As a result, in the opening 112, the etching is performed to pierce through from the fourth insulating film 60 to the first passivation film 32 and reach the second wire 31. Then, the first via hole 71 is formed. In the opening 113, the etching is performed to pierce through from the fourth insulating film 60 to the second insulating film 30 and reach the first wire 22A. Then, the second via hole 72 is formed. By the etching, the diameter c1 of the opening 112 of the resist pattern for forming the first via hole 71 connected to the second wire 31 formed in a shallow position is designed small compared with the diameter c2 of the opening 113 of the resist pattern for forming the second via hole 72 connected to the first wire 22A. Therefore, effective aspect ratios of the via holes to be formed can be equalized.

Figure 2H:
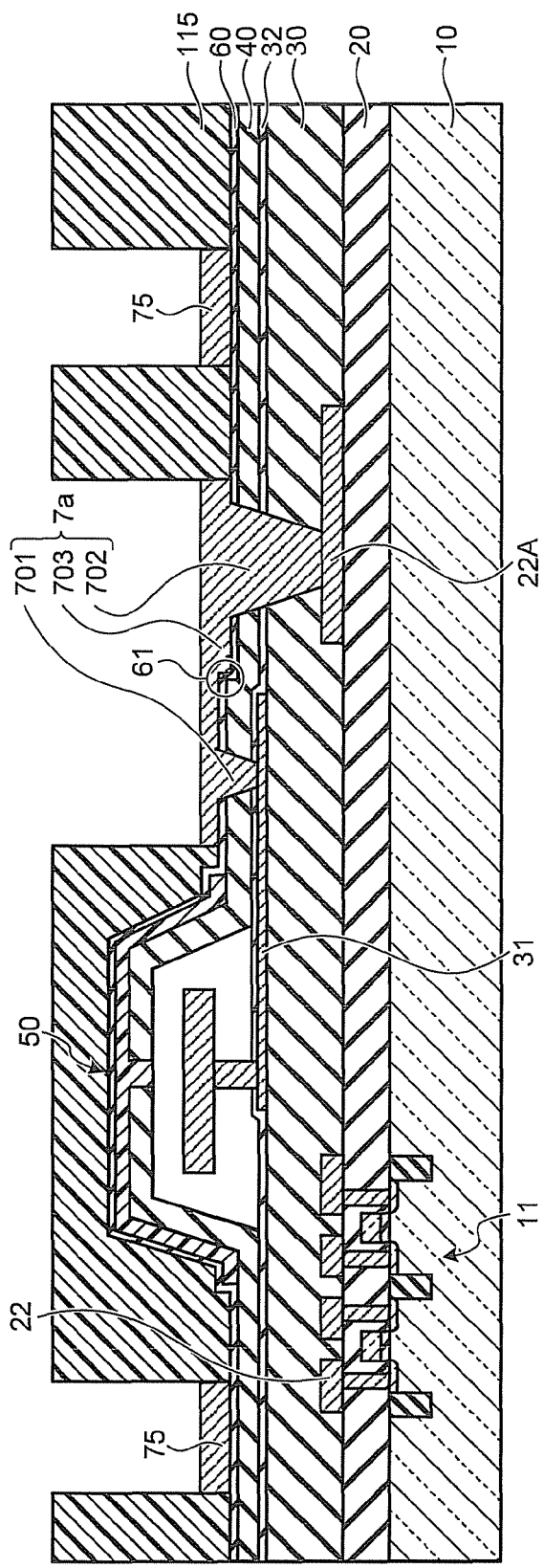

Subsequently, as shown in FIG. 2H, after the resist 111 is removed by a method such as resist stripping, a resist 115 is applied over the entire surface on the fourth insulating film 60 in which the first and second via holes 71 and 72 are formed. Thereafter, a pattern opened in regions where wires are formed is formed by the lithography technique. The resist 115 is patterned such that the first and second via holes 71 and 72 opened as shown in FIG. 2G, a region between the first and second via holes 71 and 72, and regions where the third wires 75 are formed are opened.

The connection wire 70 and the third wires 75 are formed by a method such as a plating method using copper. Specifically, the connection wire 70 having the first and second vias 701 and 702 obtained by filling copper in the formed first and second via holes 71 and 72 and the inter-via wire 703 that connects the first and second vias 701 and 702 is integrally formed. In the formation positions of the third wires 75, for example, a seed layer is formed in advance, whereby the third wires 75 are formed simultaneously with the formation of the connection wire 70. The step 61 is present on the third and fourth insulating films 40 and 60 between the first and second vias 701 and 702. Therefore, the lower surface of the inter-via wire 703 has a step to match the step 61 but the upper surface thereof is substantially flat.

Figure 2I:
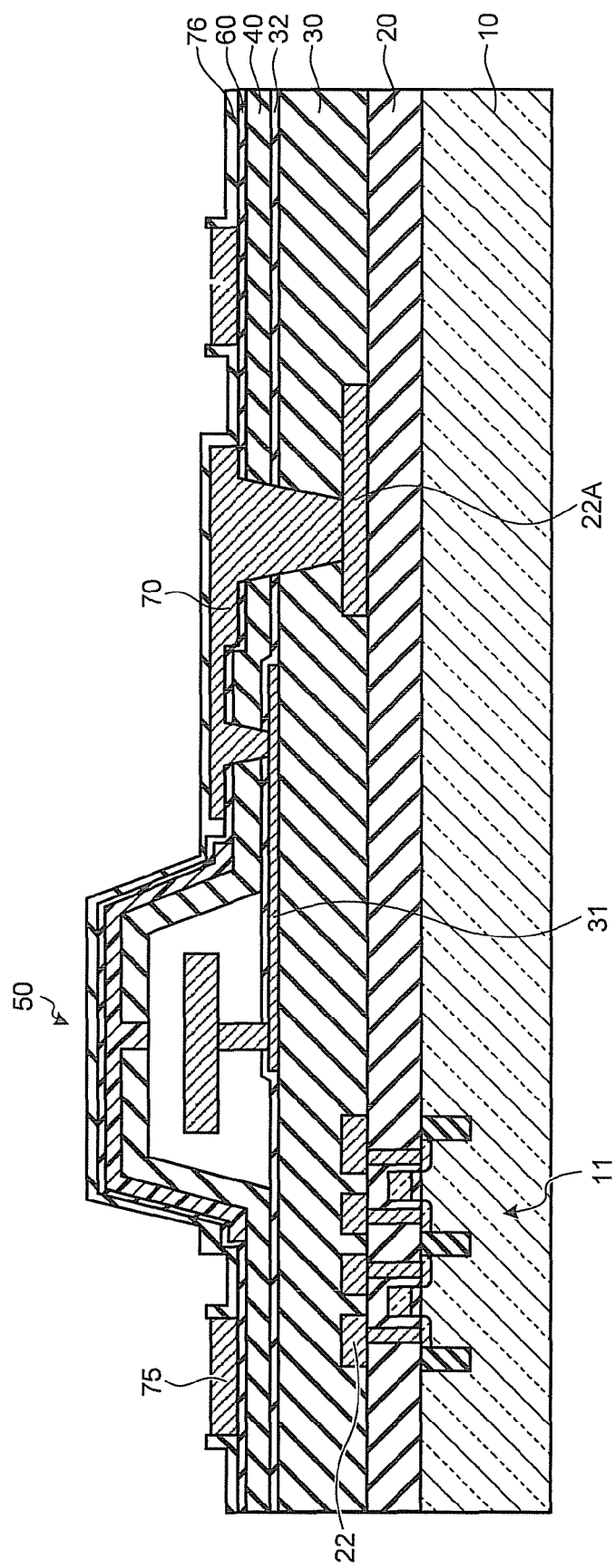

After the resist 115 is removed by a method such as resist stripping, as shown in FIG. 2I, the second passivation film 76 formed of a silicon nitride film having thickness of, for example, 0.2 micrometer is formed on the fourth insulating film 60 on which the connection wire 70 and the third wires 75 are formed.

Further, the resin layer 80 having a barrier function against steam is formed on the second passivation film 76 and the upper surface of the resin layer 80 is planarized. The through holes 81 piercing through the resin layer 80 are formed in positions corresponding to the formation positions of the third wires 75. Copper is filled in the inside of the through holes 81 by a method such as the plating method to form the pillar members 82. The bumps 83 are formed on the upper surfaces of the pillar members 82, whereby the electric component shown in FIG. 1 is obtained.

Figure 3:
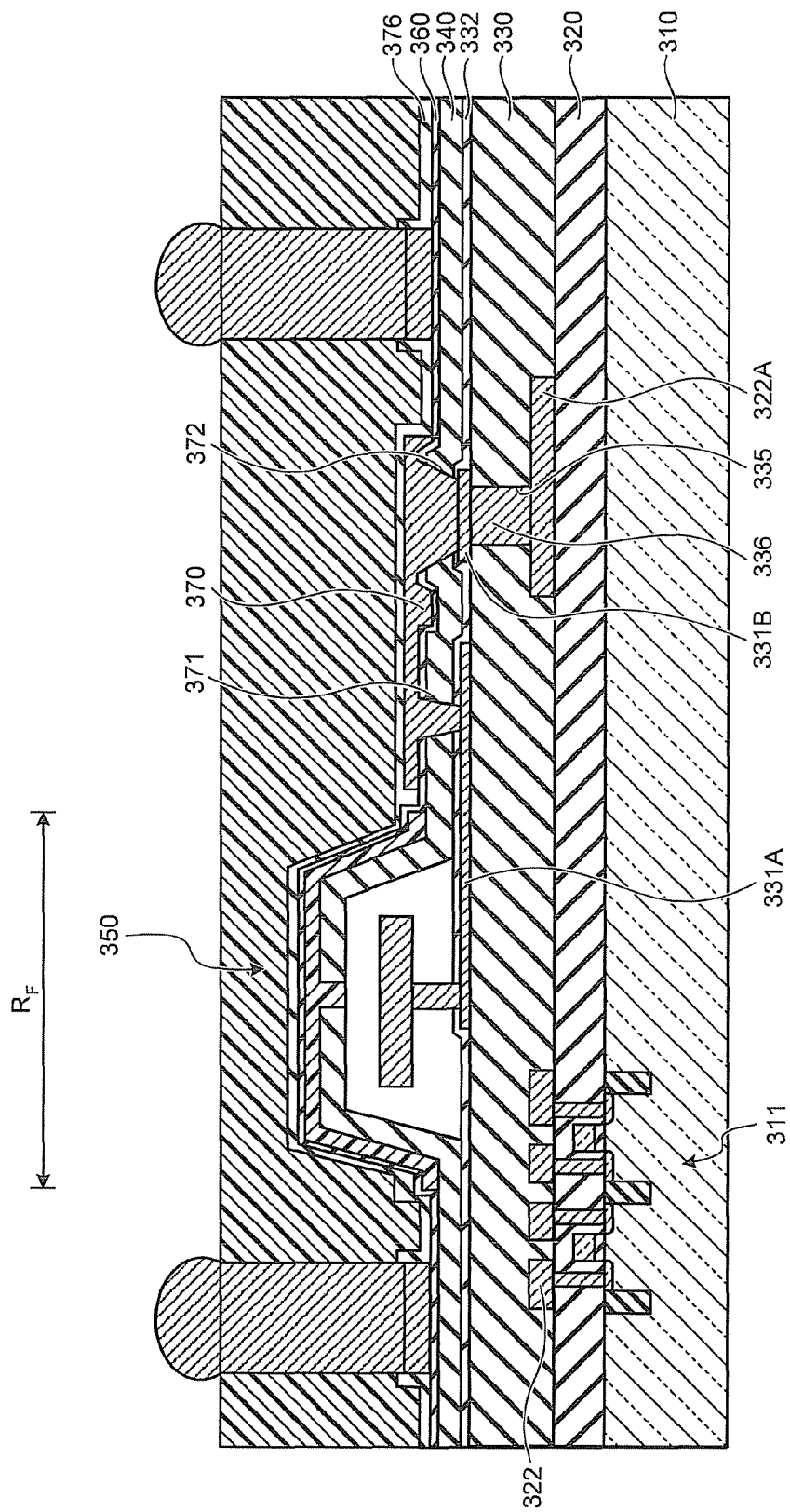
FIG. 3 is a schematic sectional view of an example of a general wiring structure for connecting a functional element and a circuit element.

FIG. 3 is a schematic sectional view of an example of a general wiring structure in which a functional element and a circuit element are connected. In the wiring structure, a CMOS transistor 311 as a circuit element and a MEMS element 350 as a functional element are stacked in the thickness direction via an insulating film. The CMOS transistor 311 is formed on a semiconductor substrate 310. First wires 322 and 322A connected to the CMOS transistor 311 are formed on a first insulating film 320. A second insulating film 330 is formed on the first insulating film 320. A second wire 331A connected to the MEMS element 350 is formed in a predetermined position of the second insulating film 330. A second wire 331B is formed to correspond to a formation position of the first wire 322A. The first wire 322A and the second wire 331B are connected to each other by a via 336 filled in a via hole 335 formed to pierce through the second insulating film 330.

A first passivation film 332 is formed on the second wires 331A and 331B. As explained in the embodiment, a third insulating film 340 including the MEMS element 350 and a fourth insulating film 360 that covers the MEMS element 350 and the third insulating film 340 are formed on the first passivation film 332.

Via holes 371 and 372 piercing through from the fourth insulating film 360 to the first passivation film 332 and respectively reaching the second wires 331A and 331B are formed in predetermined positions on the second wires 331A and 331B. A connection wire 370 that fills the via holes 371 and 372 and connects the via holes 371 and 372 is formed on the fourth inter-layer insulating film 360. Other components are the same as those in the embodiment. Therefore, detailed explanation of the components is omitted.

A procedure for forming the connection wire 370 that connects the first wire 322A connected to the circuit element and the second wire 331A connected to the functional element in the general wiring structure in which a plurality of elements are connected via insulating films is explained below. First, the via 336 is formed in the formation position of the first wire 322A of the second insulating film 330. The second wire 331B connected to the via 336 is patterned on the second insulating film 330. During the patterning, the second wire 331A connected to the MEMS element 350 is also formed.

Subsequently, the MEMS element 350 is formed on the second insulating film 330. At this point, the third and fourth insulating films 340 and 360 are also formed. Thereafter, the via holes 371 and 372 piercing through from the fourth insulating film 360 to the first passivation film 332 are formed in formation positions of the second wires 331A and 331B. The connection wire 370 that fills the via holes 371 and 372 and connects the via holes 371 and 372 is formed by a method such as the plating method.

In this way, in the general wiring structure, wires and vias such as the first wire 322A, the via 336, the second wire 331B, the connection wire 370, and the second wire 331A are alternately formed between the CMOS transistor 311 (the circuit element) and the MEMS element 350 (the functional element). There are many connection interfaces. Therefore, when vias and wires are formed, it is likely that positional deviation or the like occurs between the vias and wires and vias and wires in a lower layer already formed. There is a problem in reliability of connection. When the processing for forming vias and wires is performed for each insulating film as explained above, the number of steps increases.

However, according to this embodiment, only the first wire 22A, the connection wire 70, and the second wire 31 are formed between the CMOS transistor 311 (the circuit element) and the MEMS element 350 (the functional element). Therefore, the number of connection interfaces of wires is low compared with the example shown in FIG. 3. In particular, no wire is formed on the second insulating film 30 on the first wire 22A. Therefore, there is an effect that, when vias and wires are formed, a degree of occurrence of positional deviation between the vias and wires and vias and wires in a lower layer already formed can be suppressed. Further, processing for each insulating film is not performed and, for example, like the second via hole 72, the via hole 72 piercing through from the fourth insulating film 60 to the second insulating film 30 is collectively formed and the via 702 is formed in the via hole 72. Therefore, there is also an effect that the number of steps can be reduced compared with the example shown in FIG. 3. As a result, it is possible to provide a highly reliable electric component at low cost. It is possible to realize a reduction in thickness of an electric component through stack of a plurality of elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electric component comprising:
    a first wire connected to a circuit element and having a predetermined shape;
    a first insulating layer formed on the first wire, a lower surface of the first insulating contacting the first wire;
    a second wire formed on an upper surface of the first insulating layer;
    a functional element formed on the second wire;
    a second insulating layer that covers the second wire and the functional element, wherein the second insulating layer forms a cavity around the functional element, a part of the cavity is disposed between the second insulating layer and the functional element; and a connection wire that connects the second wire and the first wire, wherein the connection wire includes:

a first via formed in the second insulating layer;

a second via formed in the first and second insulating layers;

an inter-via wire formed to connect the first via and the second via on the second insulating layer, the first via, the second via, and the inter-via wire are integrally formed of a same material, and an opening diameter of the first via hole is smaller than an opening diameter of the second via hole.

2. The electric component according to claim 1, wherein depth of the first via hole is smaller than depth of the second via hole.

3. The electric component according to claim 1, wherein the opening diameters of the first and second via holes are set according to depths of the via holes such that aspect ratios in the via holes are the same.

4. The electric component according to claim 1, wherein aspect ratios of the first and second via holes are substantially the same.

5. The electric component according to claim 1, wherein the circuit element is a CMOS transistor; and the functional element is a MEMS element.

6. The electric component according to claim 1, wherein an upper end of the first via hole is located above an upper end of the second via hole.

7. The electric component according to claim 1, wherein a lower surface of the inter-via wire has a step and an upper surface of the inter-via wire is substantially flat.

8. The electric component according to claim 1, wherein the upper surface and the lower surface of the first insulating layer are on opposite sides of the first insulating layer from each other.

9. The electric component according to claim 1, wherein an upper surface of the inter-via wire is lower than an upper surface of the second insulating layer which is disposed above the functional element.

10. The electric component according to claim 1, wherein the second insulating layer has a structure in which a plurality of insulating films are stacked.

11. The electric component according to claim 1, wherein the second insulating layer which is disposed above the functional element has an opening.

12. The electric component according to claim 11, wherein the second insulating layer has a structure in which a plurality of insulating films are stacked, and an insulating layer having a through hole as the opening is included in the plurality of the insulating films.

13. The electric component according to claim 11, wherein the opening is disposed to face the cavity.

14. The electric component according to claim 1, wherein the functional element is a movable element in the cavity.

* * * * *